(12) United States Patent
Brown et al.

(10) Patent No.: US 8,444,442 B2
(45) Date of Patent: *May 21, 2013

(54) AIR CONDITIONING WIRING SYSTEM

(75) Inventors: Steven C. Brown, The Colony, TX (US);
Carlos O. Chamorro, Plano, TX (US);
Merlin K. Chapin, The Colony, TX
(US); Robert W. Gilkison, Lewisville,
TX (US); Aylan A. Him, Irving, TX
(US); Randall L. Lisbona, Coppell,
TX (US); Richard A. Mauk, Lewisville, TX
(US); Michael Renker, McKinney, TX
(US)

(73) Assignee: Lennox Industries Inc., Richardson, TX (US)

( * ) Notice: Subject to any disclaimer, the term of this patent is extended or adjusted under 35 U.S.C. 154(b) by 10 days.

This patent is subject to a terminal disclaimer.

(21) Appl. No.: 13/357,348

(22) Filed: Jan. 24, 2012

(65) Prior Publication Data

US 2012/0122323 A1 May 17, 2012

Related U.S. Application Data

(63) Continuation of application No. 12/694,437, filed on Jan. 27, 2010, now Pat. No. 8,123,571.

(60) Provisional application No. 61/180,405, filed on May 21, 2009.

(51) Int. Cl.
*H01R 13/64* (2006.01)

(52) U.S. Cl.
USPC .......................................................... 439/680

(58) Field of Classification Search
USPC ............................ 439/79, 374–378, 651, 680
See application file for complete search history.

(56) References Cited

U.S. PATENT DOCUMENTS

| 7,922,534 B2 | 4/2011 | Lin et al. | |
|---|---|---|---|
| 8,123,571 B2 * | 2/2012 | Brown et al. | 439/680 |
| 2009/0142970 A1 | 6/2009 | Patel et al. | |
| 2010/0293991 A1 | 11/2010 | Brown et al. | |
| 2011/0143569 A1 | 6/2011 | Mito et al. | |

FOREIGN PATENT DOCUMENTS

| DE | 10127504 A1 | 12/2002 |
|---|---|---|
| DE | 102007052462 A1 | 5/2009 |
| EP | 0392629 A1 | 10/1990 |
| EP | 0441525 A2 | 8/1991 |
| EP | 1990872 A1 | 11/2008 |
| FR | 2929453 A1 | 10/2009 |

* cited by examiner

*Primary Examiner* — Khiem Nguyen (57) ABSTRACT

A wiring system for use in an air conditioning system comprising a printed circuit board having wiring receptacles and wiring connectors. In one aspect, at least some of the wiring receptacles comprise two or more wiring sub-receptacles, and each of the wiring sub-receptacles includes a slotted sub-receptacle connection pattern. Furthermore, the slotted sub-receptacle connection pattern of each of the wiring sub-receptacles is different from every other sub-receptacle connection pattern. Each of the wiring connectors includes a ridged connection pattern that is different from every other ridged connection pattern of the wiring connectors, such that a given wiring connector is receivable within only one of the wiring sub-receptacles. An air conditioning system and a method of manufacturing is also provided.

27 Claims, 7 Drawing Sheets

AIR CONDITIONING WIRING SYSTEM

CROSS-REFERENCE TO RELATED APPLICATION

This application claims the benefit of U.S. patent application Ser. No. 12/694,437 filed on Jan. 27, 2010, filed by Steven C. Brown, et al., entitled "Air Conditioning Wiring System" currently allowed, which claims priority to Provisional Application Ser. No. 61/180,405, filed by Mark Beste, et al., on May 21, 2009, entitled "Comprehensive HVAC Control System," and incorporated herein by reference in its entirety.

TECHNICAL FIELD

This application is directed, in general, to air conditioning wiring and, more specifically, to a wiring system for air conditioning units to reduce connections errors in servicing the units.

BACKGROUND

Current air conditioning systems, especially rooftop units have very disorganized wiring. The wiring harnesses are complex and wires frequently cross each other between the system components and the control board. This leads to difficulty in manufacturing, assembly and especially troubleshooting. Wires are coupled to the system components and the control board in what might appear to be a random fashion as dictated by the design of the control circuit board and the placement thereon of the wiring connectors.

This lack of organization leads to problems of misconnection, especially by field technicians, as the wiring connectors are, in many instances, interchangeable. For example, wiring leads from a temperature sensor may be connected to a connector intended for a humidity sensor and visa versa. This can lead to errors in servicing the unit, which in turn can lead to a malfunction in the operation of the unit.

SUMMARY

One aspect provides a wiring system for use in an air conditioning system comprising a printed circuit board having wiring receptacles and wiring connectors. In this embodiment, at least some of the wiring receptacles comprise two or more wiring sub-receptacles, and each of the wiring sub-receptacles includes a slotted sub-receptacle connection pattern. Furthermore, the slotted sub-receptacle connection pattern of each of the wiring sub-receptacles is different from every other sub-receptacle connection pattern. Each of the wiring connectors includes a ridged connection pattern that is different from every other ridged connection pattern of the wiring connectors, such that a given wiring connector is receivable within only one of the wiring sub-receptacles.

In another aspect, an air conditioning system comprising a compressor, a controller, a thermostat and a wiring system coupling the compressor, the controller and the thermostat together is provided. In this embodiment, the wiring system includes a printed circuit board having wiring receptacles and wiring connectors. At least some of the wiring receptacles comprise two or more wiring sub-receptacles. Furthermore, each of the wiring sub-receptacles includes a slotted sub-receptacle connection pattern, such that the slotted sub-receptacle connection pattern of each of the wiring sub-receptacles is different from every other sub-receptacle connection pattern. Each of the wiring connectors includes a ridged connection pattern that is different from every other ridged connection pattern of the wiring connectors, such that a given wiring connector is receivable within only one of the wiring sub-receptacles.

In a third embodiment, a method of manufacturing a wiring system for use in an air conditioning system is provided. The method comprises providing a printed circuit board and wiring connectors. The printed circuit board has wiring receptacles wherein at least some of the wiring receptacles comprise two or more wiring sub-receptacles. Each of the wiring sub-receptacles includes a slotted sub-receptacle connection pattern, such that the slotted sub-receptacle connection pattern of each of the wiring sub-receptacles is different from every other sub-receptacle connection pattern. Each of the wiring connectors includes a ridged connection pattern that is different from every other ridged connection pattern of the wiring connectors, such that a given wiring connector is receivable within only one of the wiring sub-receptacles.

BRIEF DESCRIPTION

Reference is now made to the following descriptions taken in conjunction with the accompanying drawings, in which.

DETAILED DESCRIPTION

Figure 1:
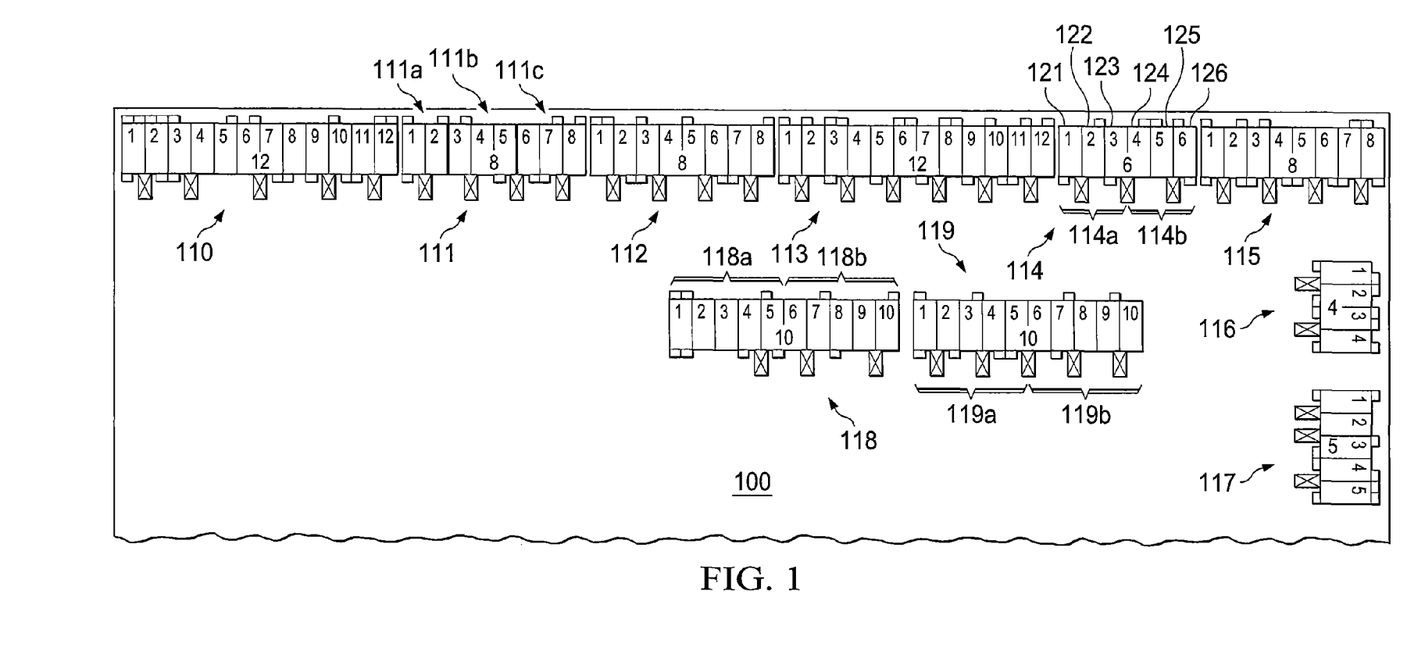
FIG. 1 is a partial plan view of one embodiment of a printed circuit board comprising a plurality of wiring receptacles constructed according to the principles of the present invention.

Referring initially to FIG. 1, illustrated is a partial plan view of one embodiment of a printed circuit board 100 comprising a plurality of wiring receptacles 110-119 constructed according to the principles of the embodiments discussed herein. The wiring receptacles 110-117 are located proximate the perimeter of the printed circuit board 100 for ease of access to remove or insert appropriate wiring connectors (not shown). The prior art has typically relied on placing wiring connectors to off-the-board components near the on-board component being connected to. This results in essentially random wiring to the board connections. In many instances, the receptacles on the board are of the same type and configuration, leading to the likelihood for improper connection. In the present invention, the receptacles are positioned near the perimeter of the board thereby making them more readily accessible. Additionally, the receptacles are functionally grouped so that the wiring can be manufactured in bundles that connect to off-the-board components. In one embodiment, the wiring receptacles 110-119 are grouped functionally, e.g., wiring receptacle 110 groups all connections for an economizer, wiring receptacle 111 groups all connections for the high and low pressure compressor controls, wiring receptacle 112 groups all connections for the blower deck area, and wiring receptacle 113 groups all connections for the system contactors and relays, etc. By way of further example, wiring receptacle 114 may comprise heating control contact points 121-126 which are as follows: contact point 121 is 24 VAC Common; contact point 122 is Electric Heat #1; contact point 123 is Electric Heat #2; contact point 124 is 24 VAC Common; contact point 125 is Electric Heat #3; and contact point 126 is Electric Heat #4. Thus, all controls for up to four electric heaters within the air conditioning system are controlled through wiring receptacle 114. It should be understood that the foregoing receptacle configuration and its stated function is given as an example only and that other receptacles configurations and functions, as design parameters require are also applicable.

Each of the wiring receptacles 110-119 may comprise one or more sub-receptacles, e.g., wiring receptacle 111 comprises three sub-receptacles 111a-111c. A sub-receptacle as used herein is a receptacle that is configured to receive a particular corresponding connector and may include any number of pin and connector configurations. In this instance, pins 1 and (sub-receptacle 111a) of wiring receptacle 111 comprise a reversing valve contact and 24 VAC power, respectively. Pins 3, 4 and 5 (sub-receptacle 111b) comprise high pressure compressor #1, 24 VAC Power and low pressure compressor #1, respectively. Pins 6, 7 and 8 (sub-receptacle 111c) comprise high pressure compressor #2, 24 VAC Power and low pressure compressor #2, respectively.

In one embodiment, the printed circuit board 100 may further comprise two or more wiring receptacles having the same functional grouping. For example, receptacle 118 is for a Heating Sensor #1 and receptacle 119 is for a Heating Sensor #2. Receptacle 118 is for use with one model of air conditioning system and receptacle 119 is for use with a different model of air conditioning system. Thus, the printed circuit board 100 may be used with more than one model of air conditioning system just by configuring the printed circuit board 100 with the necessary connections to prevent incorrect connection to a particular wiring harness. While the pin count of receptacles 118, 119 are the same, the receptacles 118, 119 will only accept a properly configured wiring connector as will be explained in detail below. Each of receptacle 118 and receptacle 119 comprise sub-receptacles. For example, each receptacle 118 and 119 has two (2) sub-receptacles, 118a, 118b, 119a and 119b, respectively, of five (5) pins each. From the left end of each of receptacles 118a and 119a of FIG. 1, the pins are: 1-5, and in one embodiment may be designated for a Primary Limit Burner C (closed), Primary Limit Burner #NC (normally closed), and Primary Limit Burner # NO (normally open), Secondary Limit Burner #C and Secondary Limit Burner #NC. From the left of each of the receptacles 118b and 119b of FIG. 1 the pins are: 6-10 and in one embodiment may be designated for a Rollout Switch Burner #, Rollout Switch Burner #, Cab Proof Switch; Cab Proof Switch, Gas Valve Sensor #; where # is 1 (first—receptacle 118) or 2 (second—receptacle 119) Burner.

Figure 2:
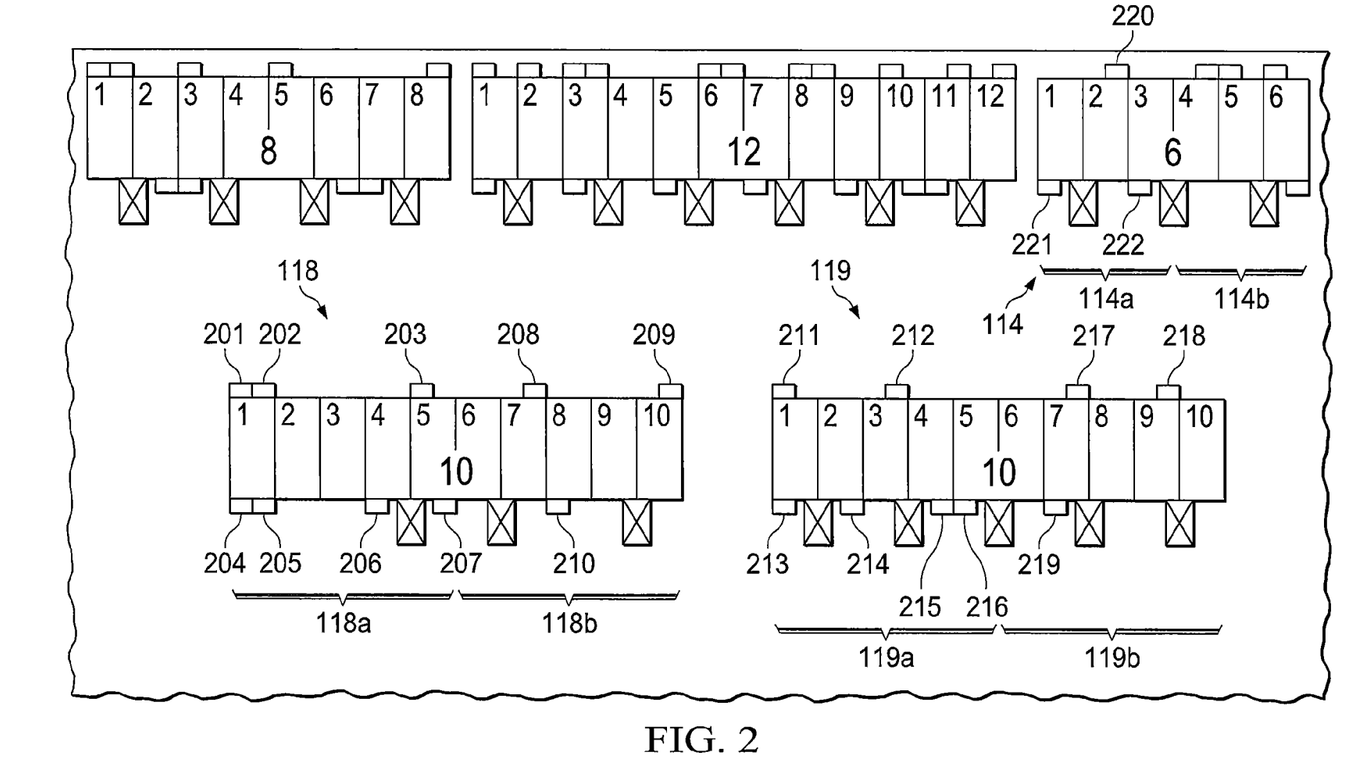
FIG. 2 is a close up plan view of a portion of the printed circuit board of FIG. 1.

Referring now to FIG. 2, illustrated is a close up plan view of a portion of the printed circuit board 100 of FIG. 1 especially showing receptacles 118, 119 and their respective sub-receptacles 118a, 118b, 119a and 119b. Note that while there are 10 pins in each receptacle (5 pins per sub-receptacle), there is a combination of slots 201-219 at the periphery of each sub-receptacle 118a, 118b, 119a and 119b. Note that sub-receptacle 118a has slots 201-207, sub-receptacle 118b has slots 208-210, sub-receptacle 119a has slots 211-216, and sub-receptacle 119b has slots 217-219. Closer observation of the slots 201-219 show that they form specific patterns with respect to the sub-receptacles of which they are a part. The slots can be on either or both sides of a pin. For example, pin 1 of sub-receptacle 118a has four slots 201, 202, 204 and 205 associated therewith, thereby utilizing all four available slot positions. Pin 4 of sub-receptacle 118a has a single slot 206 associated therewith and pin 5 of sub-receptacle 118a has two slots 203 and 207, one on either side of pin 5 and associated therewith. In contrast, pin 1 of sub-receptacle 119a has two slots 211 and 213 associated therewith. Pin 2 of sub-receptacle 119a has one slot 214 associated therewith and pin 3 of sub-receptacle 119a has a single slot 212 associated therewith. Pin 4 of sub-receptacle 119a has one slot 215 associated therewith and pin 5 of sub-receptacle 119a has a single slot 216 associated therewith. Note that although some of the pins of sub-receptacle 118a have the same number of slots associated with the corresponding pin of sub-receptacle 119a, the placement of the slots in relation to the pin is different, i.e., pin 4 on each of sub-receptacles 118a, 119a each have one slot associated therewith. However, the location of the slot in relation to the pin is different for each sub-receptacle. As seen from the foregoing, there is presented a system where the connection pattern of any given sub-receptacle is different from the connection pattern of every other sub-receptacle. This provides the benefit of simplifying servicing of the unit and reduces errors in electrically connecting components together.

Figure 3A:
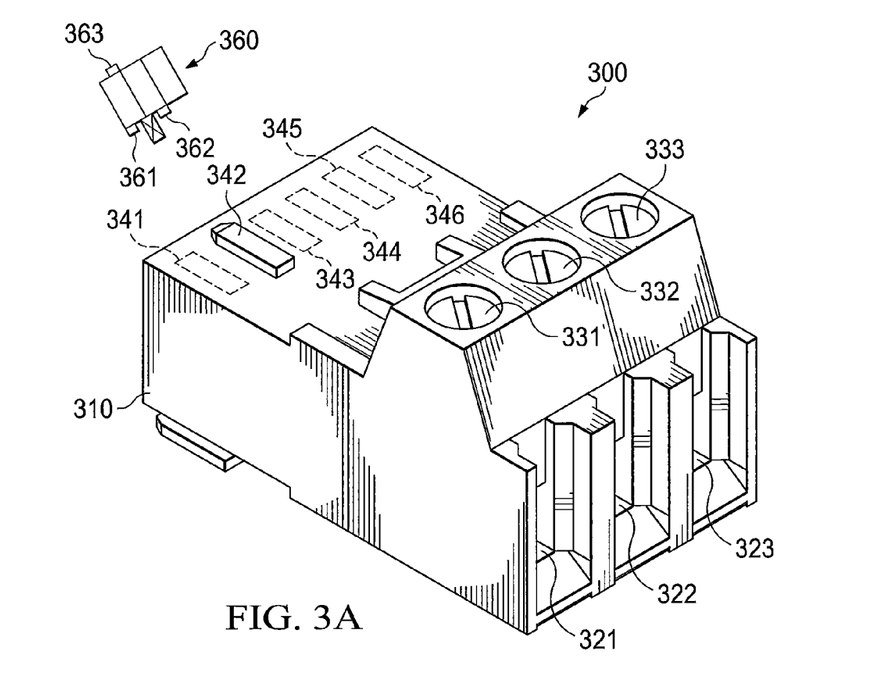
FIG. 3A is an isometric view of one embodiment of a representative wiring connector for use with a sub-receptacle of the type described in FIG. 2.
Figure 3B:
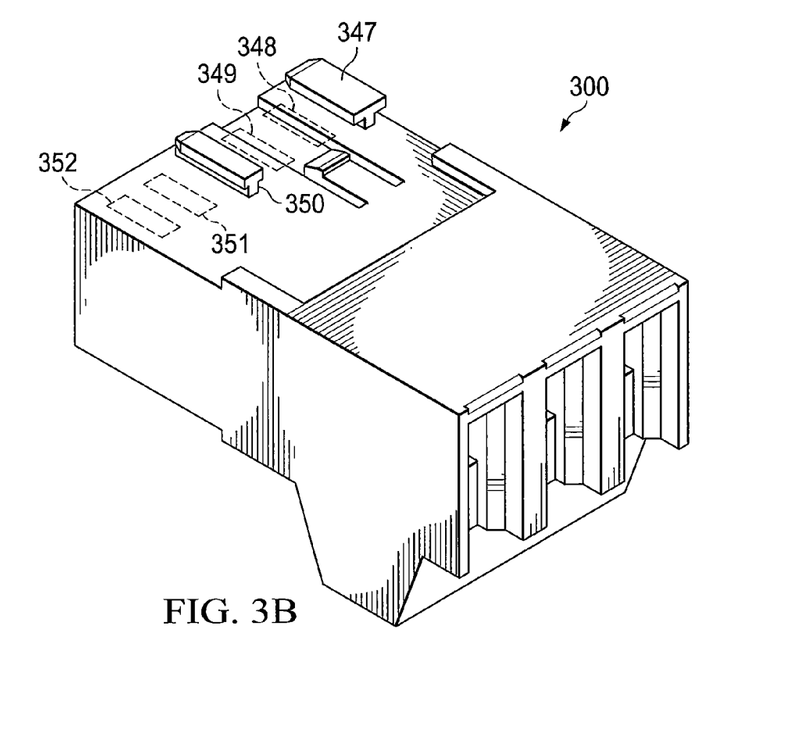
FIG. 3B is an isometric view of the underside of the wiring connector 300 of FIG. 3A.

Referring now to FIG. 3A and FIG. 3B, illustrated in FIG. 3A is an isometric view of one embodiment of a representative wiring connector 300 for use with a sub-receptacle 360 of the type described above. FIG. 3B illustrates the underside of the wiring connector 300 of FIG. 3A. The wiring connector 300, as illustrated, is for a three wire sub-receptacle. The wiring connector 300 comprises a connector body 310, wire access ports 321-323, contact screws 331-333 and ridge positions 341-346. Of the six ridge positions 341-346 shown, only one ridge position 342 has a ridge thereat. FIG. 3B illustrates an additional six ridge positions 347-352 on the underside of the wiring connector 300. For the purpose of this discussion, two of the additional six ridge positions 347-352 comprise a ridge, i.e., positions 347 and 350. The wiring connector 300 is preferably of molded plastic with metallic wiring terminals (not shown) therein. To employ the wiring connector 300, appropriate wires (not shown) are stripped from a pre-measured wiring harness and inserted into the appropriate wire access ports 321-323. The contact screws 331-333 are then tightened onto the wires. Of course, the wiring connector 300 could also be molded in place on appropriate wires if desired. The wiring connector 300 is then ready to couple to the appropriate sub-receptacle 360. It can be seen by one who is of ordinary skill in the art that ridge 342 cooperates with slot 363 and ridges 347 and 350 cooperate with slots 361 and 362, respectively.

Referring now to FIGS. 1 and 3, the wiring receptacle 114 comprises wiring sub-receptacles 114a and 114b, each having three pins or contact points. Examination of the slot pattern of wiring sub-receptacles 114a and 114b indicate that the wiring connector 300 can not be inserted in any of the wiring sub-receptacles 114a, 114b as the ridges and slots do not match either of these patterns. Thus, the wiring connector 300 is prevented from being incorrectly connected to the board 100. Additionally, wiring sub-receptacles 114a, 114b may further each have a distinct color, e.g., blue, red, etc., that is matched with the same color of the appropriate wiring connector (not shown). This color matching of wiring connector to sub-receptacle is continued throughout the printed circuit board 100. This additionally assists the technician in choosing the correct sub-receptacle for inserting the wiring connector.

Figure 4:
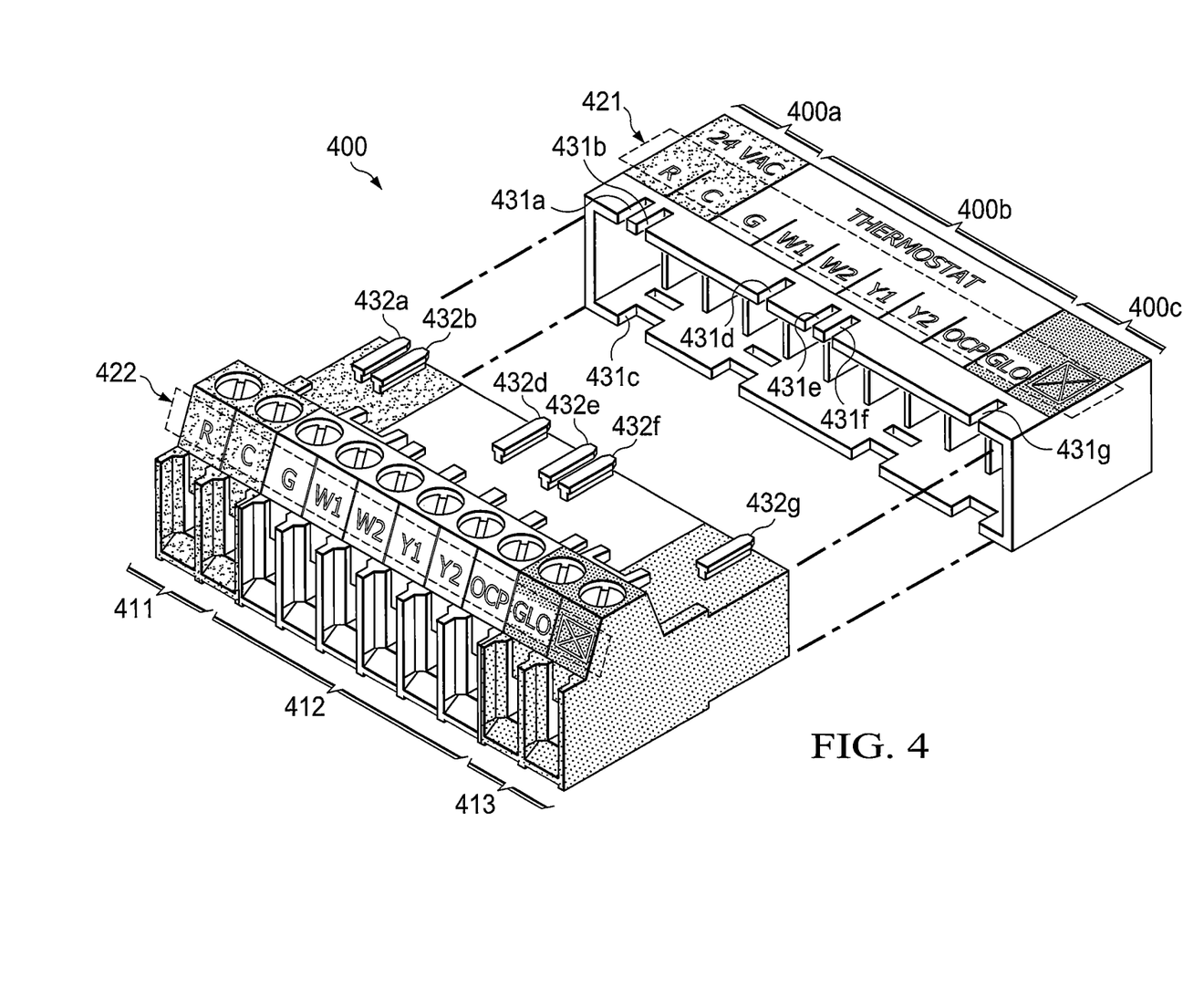
FIG. 4 is an isometric view of one receptacle having three sub-receptacles and matching three wiring connectors.

Referring now to FIG. 4, illustrated is an isometric view of one receptacle 400 having three sub-receptacles 400a, 400b, 400c and the matching three wiring connectors 411, 412, 413, respectively. FIG. 4 clearly shows that sub-receptacle 400a has two pin positions, sub-receptacle 400b has six pin positions and sub-receptacle 400c has two pin positions. Notice also that the colors of the sub-receptacles 400a, 400b, 400c match the colors of the three wiring connectors 411, 412, 413. Furthermore, labels 421 on each of the pin positions of the three wiring connectors 411, 412, 413 correspond to labels 422 on the matching sub-receptacles 400a, 400b, 400c. Note also that slots 431a-431c in sub-receptacle 400a have matching ridges 432a-432c (432c not visible) on wiring connector 411. In like manner slots 431d-431f and ridges 432d-432f match between sub-receptacle 400b and wiring connector 412. Also, slot 431g in sub-receptacle 400c has a matching ridge 432g on wiring connector 413.

Figure 5A:
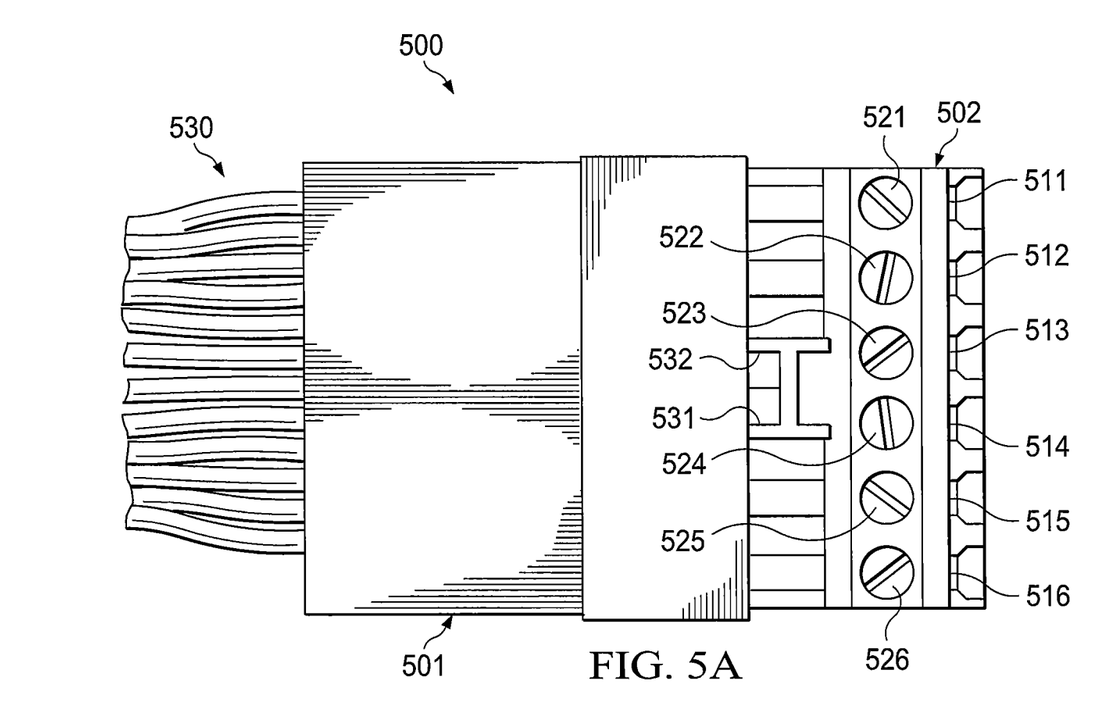
FIG. 5A is a plan view of an inline wiring connector constructed according to the principles of the present invention.

Referring now to FIG. 5A, illustrated is a plan view of an inline wiring connector 500 that may be used in connection with the embodiments discussed above. The female (first) inline wiring connector 501 comprises a number of wire positions wherein one end 530 of the wires are connected to a sub-connector (not shown) for connection to the printed circuit board 100 as described above. The other end (not visible) of the wires 510 are coupled to contacts (not visible) within the first inline wiring connector 501. The male (second) inline wiring connector 502 comprises wire access ports 511-516, contact screws 521-526 and ridges 531-532. The first inline wiring connector 501 further comprises slots (not visible) that mate with the ridges 531, 532. Of course other patterns of slots and ridges may be employed to assure that only the correct second connector is coupled to the matching first connector in the same manner as described in FIG. 4. Additionally, the matching first and second inline wiring connectors may be matching color coded and both labeled for positive identification.

Figure 5B:
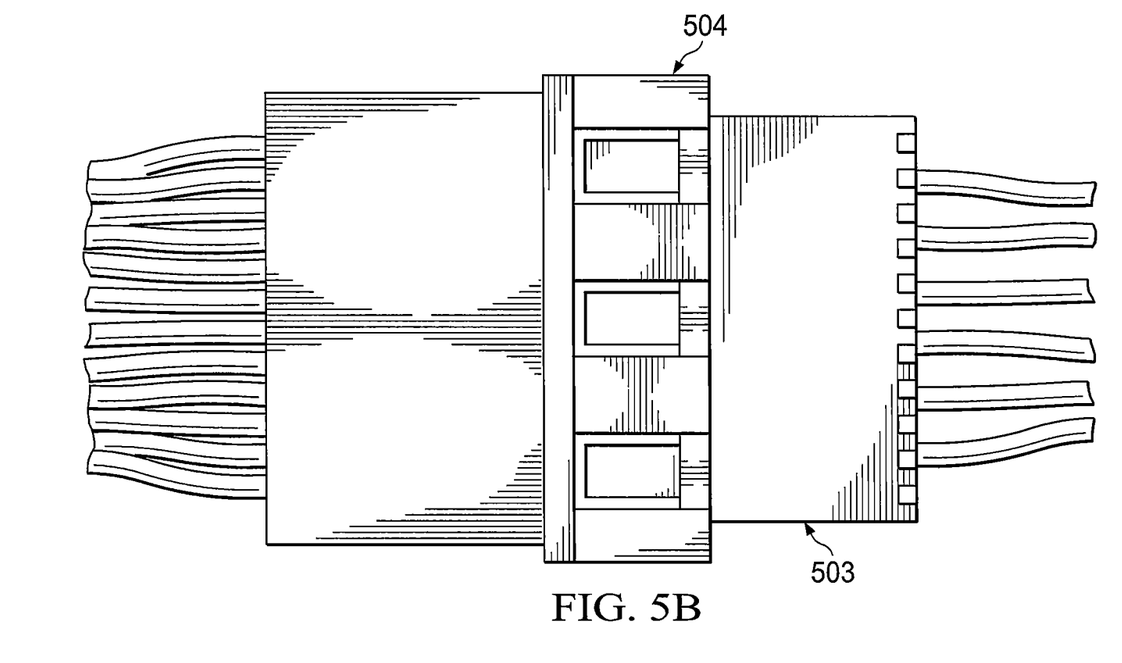
FIG. 5B is a plan view of the inline wiring connector of FIG. 5A in its completed state.

Referring now to FIG. 5B, illustrated is a plan view of the inline wiring connector 500 of FIG. 5A in its completed state. The second inline wiring connector 502 has a cover 503 thereon that includes a spring-loaded latching mechanism 504 that securely captures and holds the first inline wiring connector 501. One who is of skill in the art is familiar with the mechanism by which inline connectors lock together.

Figure 6:
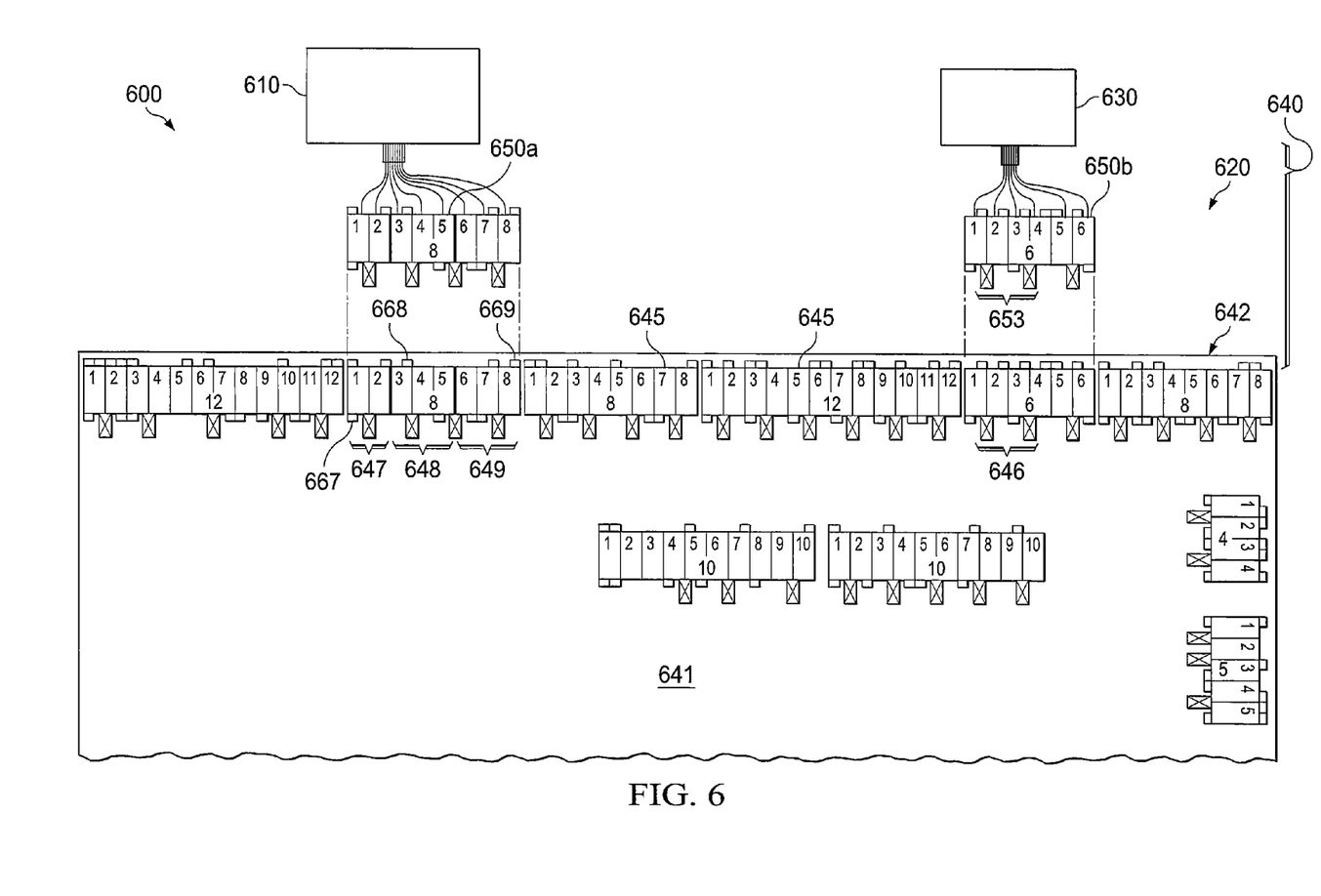
FIG. 6 is a symbolic diagram of an air conditioning system comprising a compressor, a controller, a thermostat and a wiring system coupling the compressor, the controller and the thermostat together.

Referring now to FIG. 6, illustrated is a symbolic diagram of an air conditioning system 600 comprising a compressor 610, a controller 620, a thermostat 630 and a wiring system 640 coupling the compressor 610, the controller 620 and the thermostat 630 together. In this embodiment, the wiring system 640 includes a printed circuit board 641 having a perimeter 642 and wiring receptacles 645 located proximate the perimeter 642 and wiring connectors 650a, 650b. At least some of the wiring receptacles 645 comprise two or more wiring sub-receptacles 647, 648, 649. Furthermore, each of the wiring sub-receptacles 646, 647, 648, 649 includes a slotted sub-receptacle connection pattern 666, 667, 668, 669 such that the slotted sub-receptacle connection pattern of each of the wiring sub-receptacles 646, 647, 648, 649 is different from every other sub-receptacle connection pattern. Each of the wiring connectors 650a, 650b includes a ridged connection pattern 653a, 653b that is different from every other ridged connection pattern of the wiring connectors 650a, 650b, such that a given wiring connector 653 is receivable within only one of the wiring sub-receptacles 646.

Thus, a wiring system for an air conditioning system has been described such that wiring connectors are individually coded by virtue of ridges that cooperate with slots in wiring receptacles on a printed circuit board to prevent incorrect wiring connections. The wiring connectors and wiring receptacles further comprise matching colors and labels to enhance correct identification and proper installation. An inline wiring connector utilizing the same slot and ridge, color and label coding is likewise described.

Those skilled in the art to which this application relates will appreciate that other and further additions, deletions, substitutions and modifications may be made to the described embodiments.

What is claimed is:

1. A wiring system for use in an air conditioning system, comprising:
   a printed circuit board having wiring receptacles wherein at least some of said wiring receptacles comprise two or more wiring sub-receptacles, and wherein each of said wiring sub-receptacles includes a slotted sub-receptacle connection pattern, such that said slotted sub-receptacle connection pattern of each of said wiring sub-receptacles is different from every other sub-receptacle connection pattern; and
   wiring connectors wherein each of said wiring connectors includes a ridged connection pattern that is different from every other ridged connection pattern of said wiring connectors, such that a given wiring connector is receivable within only one of said wiring sub-receptacles.

2. The wiring system as recited in claim 1 wherein each of said wiring receptacles comprise a functional grouping of related wiring sub-receptacles.

3. The wiring system as recited in claim 2 wherein said printed circuit board further comprises more than one wiring receptacle having a same functional grouping.

4. The wiring system as recited in claim 3 wherein said printed circuit board is adapted to operate with a plurality of models of an air conditioning system.

5. The wiring system as recited in claim 4 wherein each of said plurality of models uses a one of said wiring receptacles having said same functional grouping.

6. The wiring system as recited in claim 1 wherein each of said wiring sub-receptacles further comprises a sub-receptacle color designator matching a color of one of said wiring receptacles on said printed circuit board.

7. The wiring system as recited in claim 6 wherein each of said wiring connectors comprises a wiring color designator matched to a one of said corresponding sub-receptacle color designators.

8. The wiring system as recited in claim 1 wherein said printed circuit board further comprises unique receptacle labels proximate each of said wiring sub-receptacles and wherein said wiring connectors further comprise matching connector labels for each of said wiring connectors.

9. The wiring system as recited in claim 1 further comprising wiring having a first end coupled to a one of said wiring connectors and a second end coupled to a first wiring inline connector, wherein said wiring inline connector has a slotted inline connection pattern configured to cooperate with a ridged inline connection pattern of a second wiring inline connector that is different from every other ridged inline connection pattern.

10. An air conditioning system, comprising:
    a compressor;
    a controller;
    a thermostat; and a wiring system coupling said compressor, said controller and said thermostat together, said wiring system including:
- a printed circuit board having wiring receptacles wherein at least some of said wiring receptacles comprise two or more wiring sub-receptacles, and wherein each of said wiring sub-receptacles includes a slotted sub-receptacle connection pattern, such that said slotted sub-receptacle connection pattern of each of said wiring sub-receptacles is different from every other sub-receptacle connection pattern; and
- wiring connectors wherein each of said wiring connectors includes a ridged connection pattern that is different from every other ridged connection pattern of said wiring connectors, such that a given wiring connector is receivable within only one of said wiring sub-receptacles.

11. The air conditioning system as recited in claim 10 wherein each of said wiring receptacles comprise a functional grouping of related wiring sub-receptacles.

12. The air conditioning system as recited in claim 11 wherein said printed circuit board further comprises more than one wiring receptacle having a same functional grouping.

13. The air conditioning system as recited in claim 12 wherein said printed circuit board is adapted to operate with a plurality of models of an air conditioning system.

14. The air conditioning system as recited in claim 13 wherein each of said plurality of models uses a one of said wiring receptacles having said same functional grouping.

15. The air conditioning system as recited in claim 10 wherein said printed circuit board further comprises unique receptacle labels proximate a one of said wiring sub-receptacles and wherein said plurality of wiring connectors further comprise matching connector labels for a matching one of said plurality of wiring connectors.

16. The air conditioning system as recited in claim 10 further comprising wiring having a first end coupled to a one of said wiring connectors and a second end coupled to a first wiring inline connector, wherein said wiring inline connector has a slotted inline connection pattern configured to cooperate with a ridged inline connection pattern of a second wiring inline connector that is different from every other ridged inline connection pattern.

17. A method of manufacturing a wiring system for use in an air conditioning system, comprising:
- providing a printed circuit board having wiring receptacles wherein at least some of said wiring receptacles comprise two or more wiring sub-receptacles, and wherein each of said wiring sub-receptacles includes a slotted sub-receptacle connection pattern, such that said slotted sub-receptacle connection pattern of each of said wiring sub-receptacles is different from every other sub-receptacle connection pattern; and
- providing wiring connectors wherein each of said wiring connectors includes a ridged connection pattern that is different from every other ridged connection pattern of said wiring connectors, such that a given wiring connector is receivable within only one of said wiring sub-receptacles.

18. The method as recited in claim 17 wherein each of said plurality of wiring receptacles comprise a functional grouping of related wiring sub-receptacles.

19. The method as recited in claim 18 wherein said printed circuit board further comprises more than one wiring receptacle having a same functional grouping and wherein said printed circuit board is adapted to operate with a plurality of models of an air conditioning system.

20. The method as recited in claim 19 wherein each of said plurality of models uses a one of said wiring receptacles having said same functional grouping.

21. The method as recited in claim 17 wherein each of said physically unique wiring sub-receptacles further comprises a sub-receptacle color designator unique among said plurality of wiring receptacles on said printed circuit board and wherein each of said plurality of wiring connectors comprises a wiring color designator matched to a one of said corresponding sub-receptacle color designators.

22. The method as recited in claim 17 wherein said printed circuit board further comprises unique receptacle labels proximate each of said wiring sub-receptacles and wherein said plurality of wiring connectors further comprise matching connector labels for each of said plurality of wiring connectors.

23. A method of manufacturing an air conditioning system, comprising:
- providing a compressor;
- providing a controller;
- providing a thermostat; and
- coupling a wiring system to said compressor, said controller and said thermostat, said wiring system including:
  - a printed circuit board having wiring receptacles wherein at least some of said wiring receptacles comprise two or more wiring sub-receptacles, and wherein each of said wiring sub-receptacles includes a slotted sub-receptacle connection pattern, such that said slotted sub-receptacle connection pattern of each of said wiring sub-receptacles is different from every other sub-receptacle connection pattern; and
  - wiring connectors wherein each of said wiring connectors includes a ridged connection pattern that is different from every other ridged connection pattern of said wiring connectors, such that a given wiring connector is receivable within only one of said wiring sub-receptacles.

24. The method as recited in claim 23 wherein each of said wiring receptacles comprise a functional grouping of related wiring sub-receptacles.

25. The method as recited in claim 24 wherein said printed circuit board further comprises more than one wiring receptacle having a same functional grouping and wherein said printed circuit board is adapted to operate with a plurality of models of an air conditioning system.

26. The method as recited in claim 25 wherein each of said plurality of models uses a one of said wiring receptacles having said same functional grouping.

27. The method as recited in claim 23 wherein said printed circuit board further comprises unique receptacle labels proximate each of said wiring sub-receptacles and wherein said plurality of wiring connectors further comprise matching connector labels for each of said plurality of wiring connectors.

* * * * *